United States Patent
Bohr et al.

(10) Patent No.: US 11,881,452 B2
(45) Date of Patent: Jan. 23, 2024

(54) DEVICE LAYER INTERCONNECTS

(71) Applicant: Intel Corporation, Santa Clara, CA (US)

(72) Inventors: Mark Bohr, Aloha, OR (US); Mauro J. Kobrinsky, Portland, OR (US); Marni Nabors, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/843,395

(22) Filed: Jun. 17, 2022

(65) Prior Publication Data

US 2022/0319978 A1   Oct. 6, 2022

Related U.S. Application Data

(63) Continuation of application No. 16/003,031, filed on Jun. 7, 2018, now Pat. No. 11,410,928.

(51) Int. Cl.
*H01L 21/762* (2006.01)
*H01L 23/528* (2006.01)
(Continued)

(52) U.S. Cl.
CPC ...... *H01L 23/528* (2013.01); *H01L 21/76224* (2013.01); *H01L 21/76802* (2013.01); *H01L 21/76877* (2013.01); *H01L 21/823431* (2013.01); *H01L 21/823475* (2013.01); *H01L 21/823481* (2013.01); *H01L 23/3128* (2013.01);
(Continued)

(58) Field of Classification Search
CPC ............. H01L 23/528; H01L 21/76224; H01L 21/76802; H01L 21/76877; H01L 21/823431; H01L 21/823475; H01L 21/823481; H01L 23/3128; H01L 27/0886; H01L 29/0649; H01L 29/41791; H01L 23/5226; H01L 24/16; H01L 24/32; H01L 24/73; H01L 2224/16227; H01L 2224/32225; H01L 2224/73204; H01L 23/5286; H01L 25/0652; H01L 24/13; H01L 24/29; H01L 2224/131; H01L 2224/16145; H01L 2224/291; H01L 2224/81191; H01L 2924/15311;
(Continued)

(56) References Cited

U.S. PATENT DOCUMENTS

| 9,711,501 | B1 | 7/2017 | Basker et al. |
| 2006/0186543 | A1 | 8/2006 | Rowell et al. |
| 2015/0179766 | A1 | 6/2015 | Zang et al. |

FOREIGN PATENT DOCUMENTS

| EP | 3324436 A1 | 5/2018 |
| TW | 201735180 A | 10/2017 |

OTHER PUBLICATIONS

Extended European Search Report in EP Application No. 191790433.7 dated Mar. 6, 2020, 7 pages.
(Continued)

*Primary Examiner* — Elias Ullah
(74) *Attorney, Agent, or Firm* — Akona IP PC

(57) ABSTRACT

Described herein are integrated circuit (IC) structures, devices, and methods associated with device layer interconnects. For example, an IC die may include a device layer including a transistor array along a semiconductor fin, and a device layer interconnect in the transistor array, wherein the device layer interconnect is in electrical contact with multiple different source/drain regions of the transistor array.

20 Claims, 14 Drawing Sheets

(51) Int. Cl.
*H01L 21/768* (2006.01)
*H01L 21/8234* (2006.01)
*H01L 23/31* (2006.01)
*H01L 27/088* (2006.01)
*H01L 29/06* (2006.01)
*H01L 29/417* (2006.01)
*H01L 23/522* (2006.01)
*H01L 23/00* (2006.01)

(52) U.S. Cl.
CPC ...... *H01L 27/0886* (2013.01); *H01L 29/0649* (2013.01); *H01L 29/41791* (2013.01); *H01L 23/5226* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01)

(58) Field of Classification Search
CPC ......... H01L 21/76897; H01L 21/76898; H01L 21/563; H01L 23/485
See application file for complete search history.

(56) References Cited

OTHER PUBLICATIONS

Non Final Office Action in U.S. Appl. No. 16/003,031 dated Nov. 17, 2021, 8 pages.
Notice of Allowance in U.S. Appl. No. 16/003,031 dated Mar. 31, 2022, 8 pages.
United States Patent Application filed Jun. 7, 2018, U.S. Appl. No. 16/002,723, 47 pages.

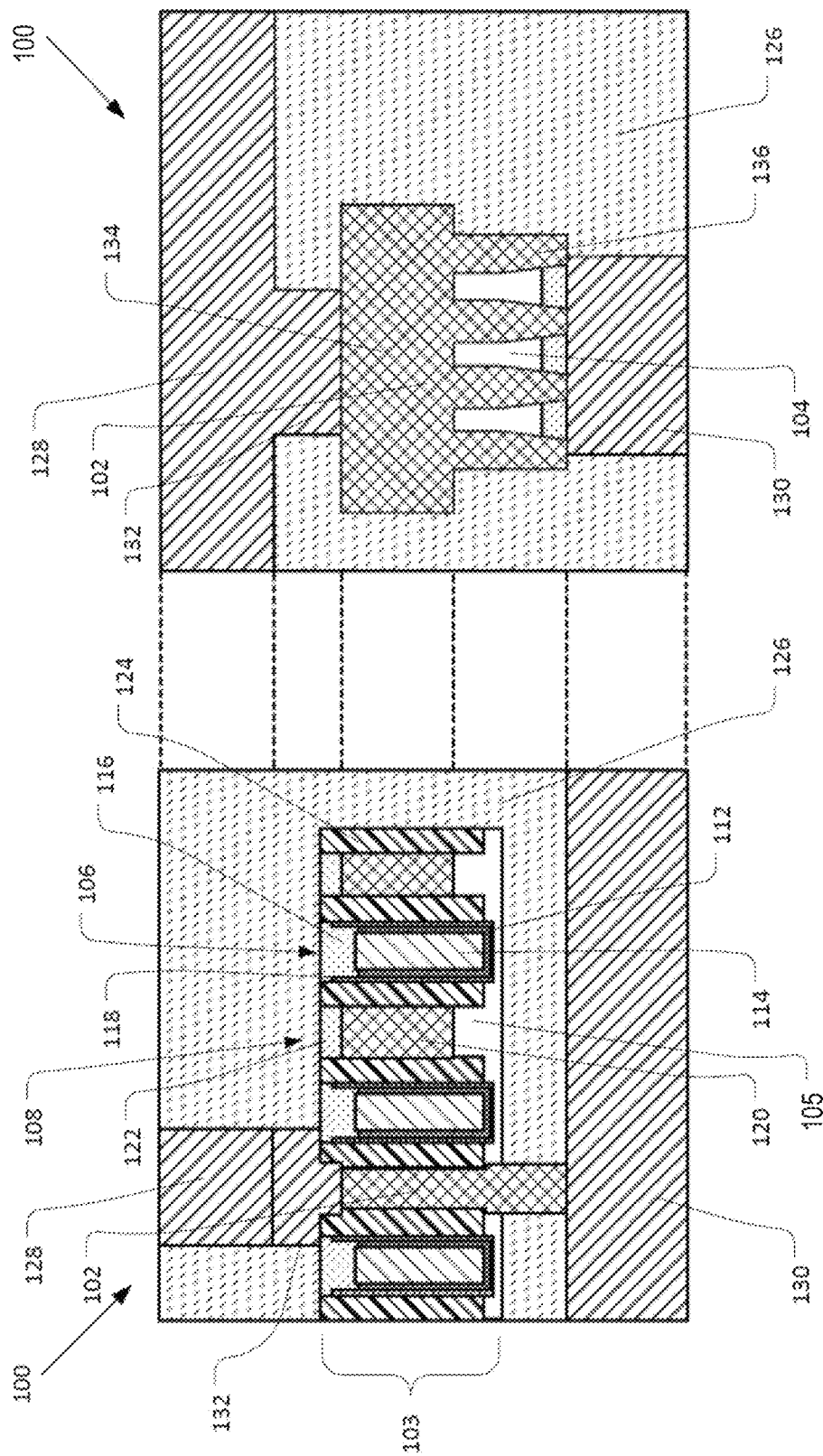

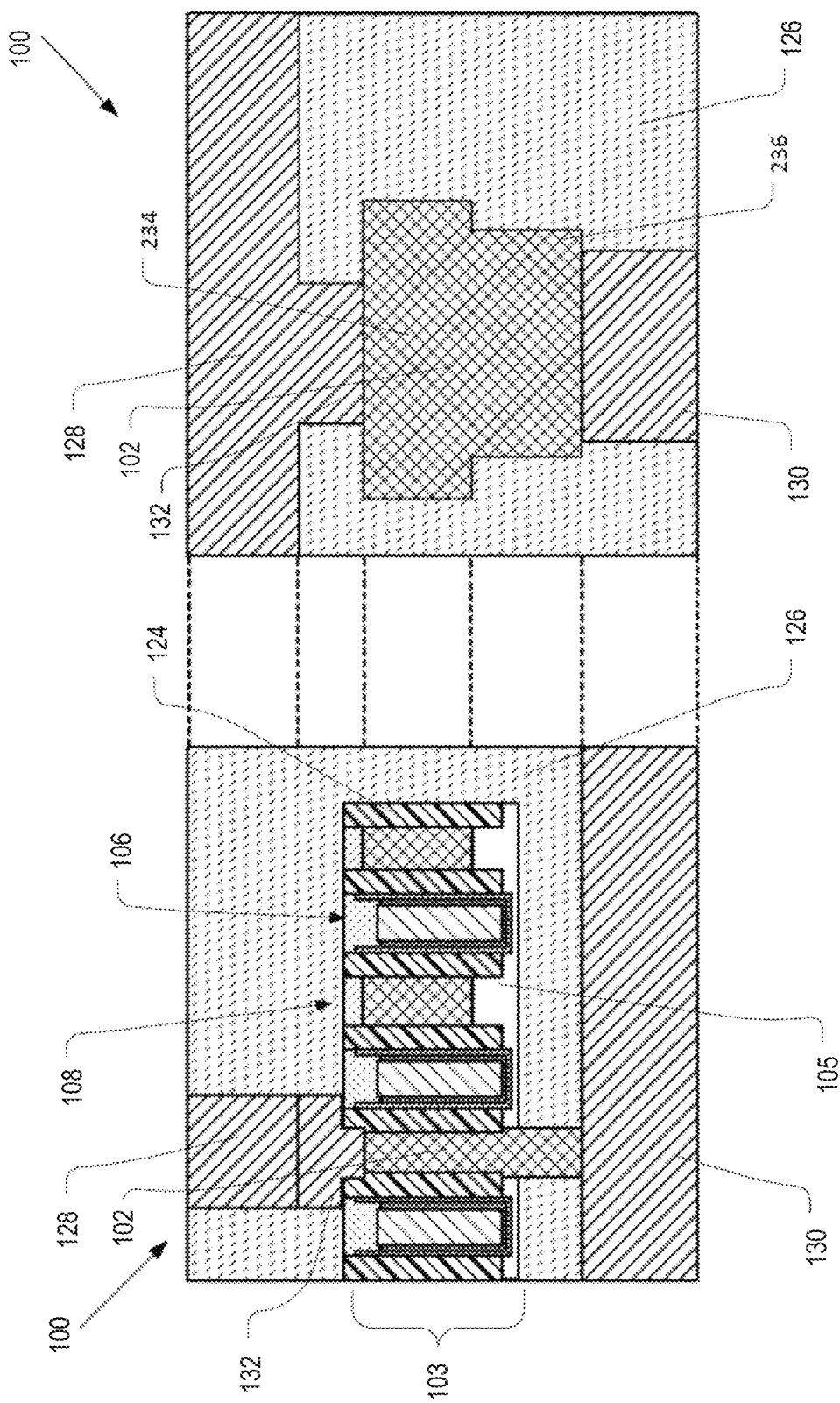

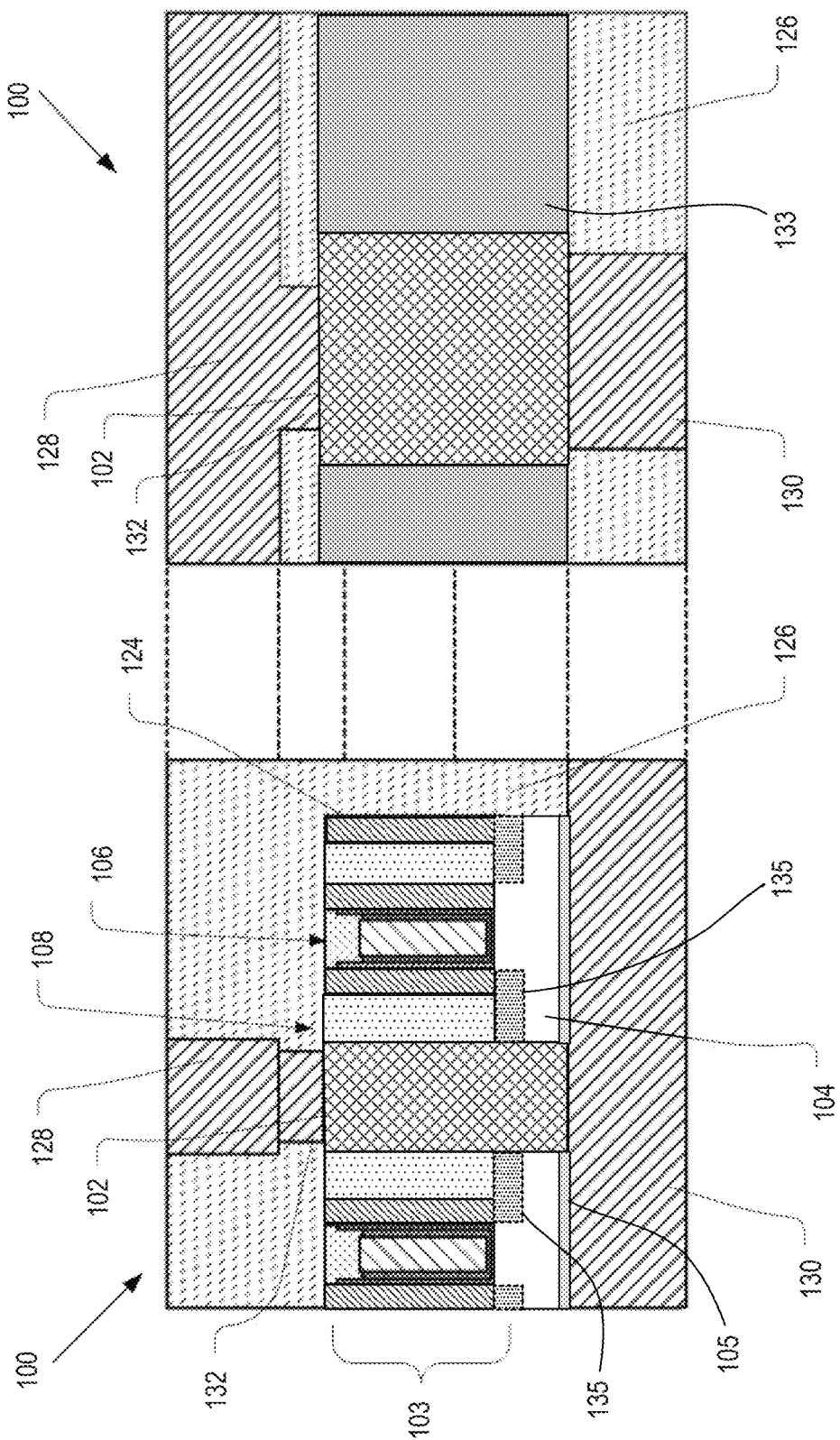

DEVICE LAYER INTERCONNECTS

CROSS-REFERENCE TO RELATED APPLICATIONS

This Application is a continuation (and claims the benefit of priority under 35 U.S.C. § 120) of U.S. application Ser. No. 16/003,031, filed Jun. 7, 2018 and entitled DEVICE LAYER INTERCONNECTS. The disclosure of the prior application is considered part of and is incorporated by reference in the disclosure of this Application.

BACKGROUND

In conventional integrated circuit (IC) dies, a metallization stack on one side of a device layer provides conductive pathways between the device layer and external devices. A semiconductor substrate is typically disposed at the other side of the device layer.

BRIEF DESCRIPTION OF THE DRAWINGS

FIGS. 1A-1C are various views of an integrated circuit (IC) structure including a device layer interconnect in a device layer of the IC structure, in accordance with various embodiments.

FIGS. 2A-2C are various views of another IC structure including a device layer interconnect in a device layer of the IC structure, in accordance with various embodiments.

FIGS. 4A-4C are various views of another IC structure including a device layer interconnect in a device layer of the IC structure, in accordance with various embodiments.

DETAILED DESCRIPTION

Figure 1A:
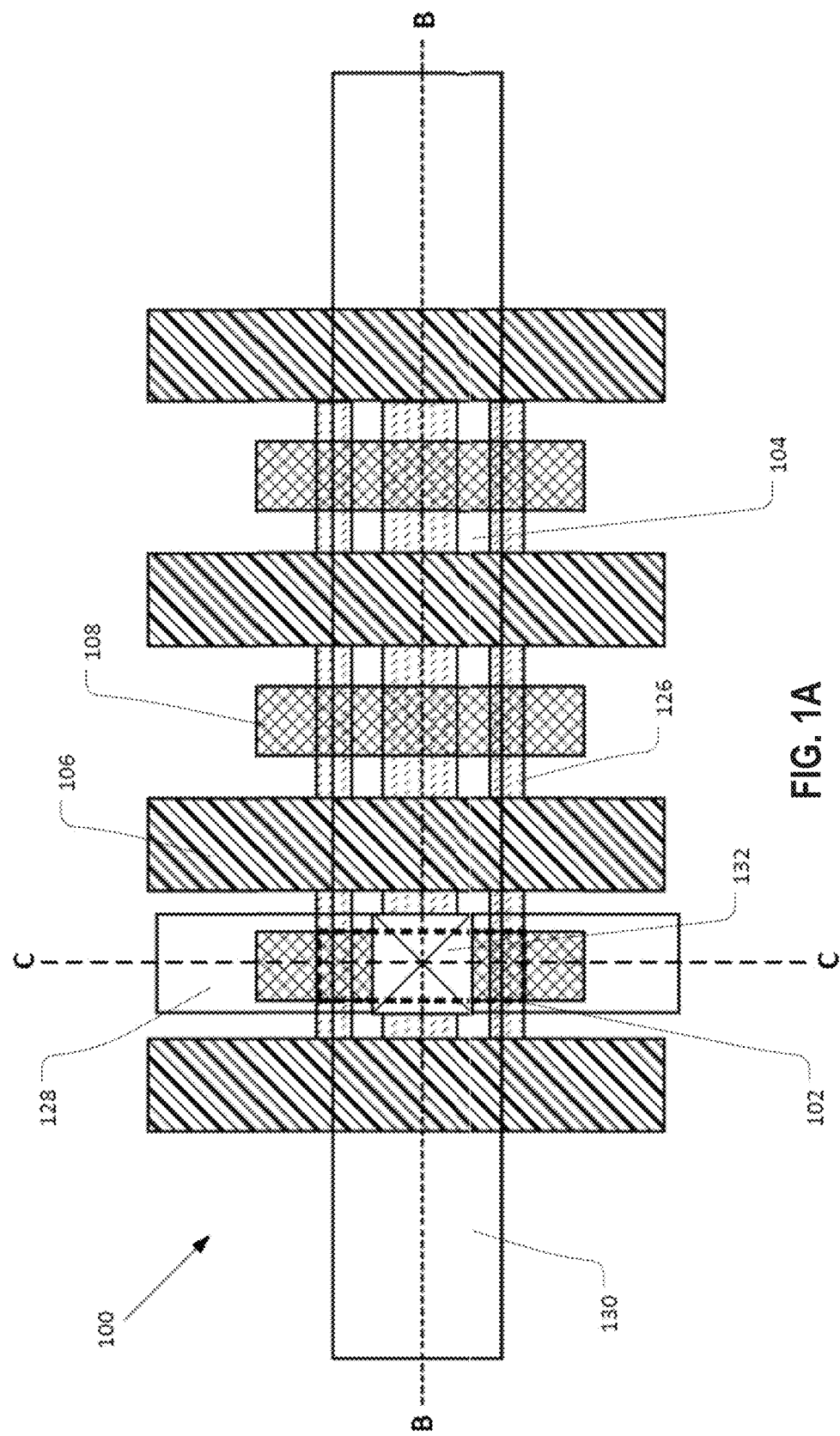

Described herein are integrated circuit (IC) structures, devices, and methods associated with device layer interconnects. For example, an IC die may include a device layer including a transistor array along a semiconductor fin, and a device layer interconnect in the transistor array, wherein the device layer interconnect is in electrical contact with multiple different source/drain regions of the transistor array.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1C, the phrase "FIG. 2" may be used to refer to the collection of drawings of FIGS. 2A-2C, etc.

In three-dimensional (3D) ICs, conductive interconnects (e.g., metal layers) are present on both the frontside and the backside of a device layer. Conventional approaches to electrically coupling the device layer to the backside interconnects, or electrically coupling the frontside interconnects to the backside interconnects, have incurred significant area penalties and/or undesirable electrical performance (e.g., excessive capacitive coupling that limits the speed at which signaling may be performed). Various ones of the embodiments disclosed herein may provide dense and readily fabricated device layer interconnects that achieve good electrical performance for modern computing applications.

The structures disclosed herein may be formed on a substrate. The substrate may be a semiconductor substrate composed of semiconductor material systems including, for example, n-type or p-type materials systems (or a combination of both). The substrate may include, for example, a crystalline substrate formed using a bulk silicon or a silicon-on-insulator (SOI) substructure. In some embodiments, the substrate may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate. Although a few examples of materials from which the substrate may be formed are described here, any material that may serve as a foundation for an IC device may be used. The substrate may be part of a singulated die (e.g., the dies 1502 of FIG. 8) or a wafer (e.g., the wafer 1500 of FIG. 8).

A plurality of transistors may be formed in a device layer on the substrate. These transistors may include one or more metal oxide semiconductor field-effect transistors (MOSFETs). To provide these transistors, the device layer may include, for example, one or more source and/or drain (S/D) regions, one or more gates to control current flow in the transistors between the S/D regions, and one or more S/D contacts to route electrical signals to/from the S/D regions. The transistors may include planar transistors, nonplanar transistors, or a combination of both. Planar transistors may include bipolar junction transistors (BJT), heterojunction bipolar transistors (HBT), or high-electron-mobility transistors (HEMT). Nonplanar transistors may include FinFET transistors, such as double-gate transistors or tri-gate transistors, and wrap-around or all-around gate transistors, such as nanoribbon and nanowire transistors. Although the accompanying drawings may illustrate only nonplanar transistors, it should be noted that the techniques and structures disclosed herein may also be applied to planar transistors, as suitable.

Each transistor may include a gate formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions may be formed within the substrate adjacent to the gate of each transistor. The S/D regions may be formed using an implantation/diffusion process or an etching/deposition process, for example. In the former process, dopants such as boron, aluminum, antimony, phosphorous, or arsenic may be ion-implanted into the substrate to form the S/D regions. An annealing process that activates the dopants and causes them to diffuse farther into the substrate may follow the ion-implantation process. In the latter process, the substrate may first be etched to form recesses at the locations of the S/D regions. An epitaxial deposition process may then be carried out to fill the recesses with material that is used to fabricate the S/D regions. In some implementations, the S/D regions may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions may be formed using one or more alternate semiconductor materials such as germanium or a group III-V material or alloy. In further embodiments, one or more layers of metal and/or metal alloys may be used to form the S/D regions.

One or more interlayer dielectrics (ILD) are deposited over the transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Embodiments described herein may be directed to front-end-of-line (FEOL) semiconductor processing and structures. FEOL is the first portion of IC fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than ten metal layers may be added in the BEOL.

Various embodiments described herein are directed to techniques for device layer interconnects in a 3D IC. In various embodiments, the 3D IC may include a device layer that includes logic transistors (e.g., in a transistor array). In some embodiments, the logic transistors may be nonplanar transistors (e.g., FinFETs). For example, a plurality of fins may be formed in the device layer, and gate stacks and S/D electrodes (e.g., source or drain electrodes) may be formed on the fins to form transistors.

The 3D IC may further include frontside interconnects in one or more metal layers on a frontside of the 3D IC (e.g., above the substrate on which the logic transistors are formed) and backside interconnects in one or more metal layers on a backside of the 3D IC (e.g., below the substrate on which the logic transistors are formed). In some embodiments, the substrate may be partially or completely removed after formation of the logic transistors.

In various embodiments, the 3D IC may further include one or more device layer interconnects that extend through the device layer of the 3D IC to provide a conductive connection between one or more of the frontside interconnects and one or more of the backside interconnects. The individual device layer interconnects may be formed in a diffusion region (e.g., source or drain region) or gate region of a dummy transistor (e.g., dummy FinFET) of the transistor array. For example, FinFETS may be at least partially formed in the device layer, including semiconductor fins, and gate stacks and S/D electrodes on the semiconductor fins in respective gate regions and diffusion regions. Then, a trench may be formed in some of the diffusion regions and/or gate regions and filled with a metal, thereby forming the device layer interconnects between the backside and frontside of the 3D IC. In some embodiments, the fins may also be removed from the trench. In other embodiments, the fins may remain in the trench, and the metal of the device layer interconnects may be disposed between and/or around the fins.

The device layer interconnects as described herein may enable a high-density and low-capacitance connection for signal routing between the frontside and backside of the 3D IC (e.g., between circuit devices and/or interconnects on the frontside and backside of the 3D IC). In some embodiments, the device layer interconnects disclosed herein may be used for routing power and/or ground signals from the backside of a 3D IC to the device layer of the 3D IC in a dense manner.

Figure 10:
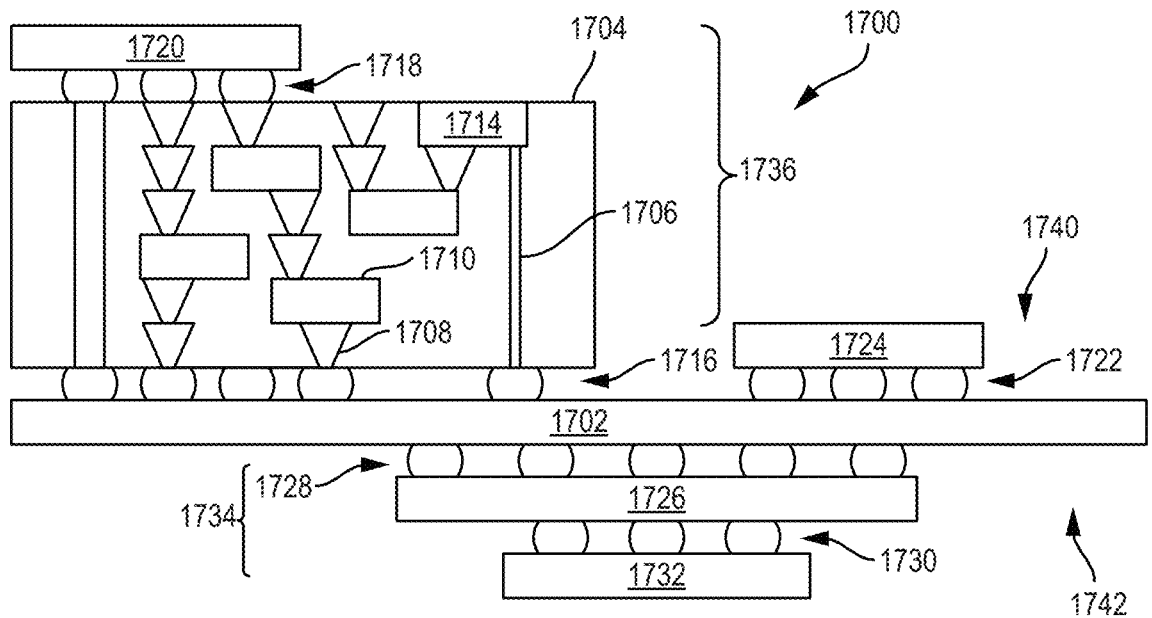
FIG. 10 is a cross-sectional side view of an IC device assembly that may include a device layer interconnect, in accordance with any of the embodiments disclosed herein.

FIG. 1A illustrates a top view of an IC structure 100 including a device layer interconnect 102 in accordance with various embodiments. FIG. 1B illustrates a side cross-sectional view along the line B-B in FIG. 1A, and FIG. 1C illustrates a side cross-sectional view along the line C-C in FIG. 1A. For ease of illustration, FIG. 1B is not a complete cross-sectional view, but represents a cross-sectional view of a portion of the IC structure 100 including three gate stacks 106; others of the accompanying "B" sub-figures utilizes the same limited view. Similarly, FIG. 10 illustrates a cross-sectional view through three fins 104 (instead of the two fins 104 of FIG. 1A) to provide a fuller picture of the accompanying structure; others of the accompanying "C" sub-figures utilize the same expanded view. The IC structure 100 of FIG. 1 may be incorporated into a 3D IC.

The IC structure 100 may include a device layer 103 including a plurality of fins 104 of a semiconductor material (e.g., silicon and/or another suitable material). The IC structure 100 may further include a gate stack 106 on a top surface and sidewalls of the fins 104 in respective gate regions, and S/D electrodes 108 on a top surface and sidewalls of the fins 104 in respective diffusion regions. Between the fins 104, a dielectric material 105 may be present. A number of elements of FIG. 1 are shared with others of the accompanying figures; for ease of discussion, a description of these elements is not repeated, and these elements may take the form of any of the embodiments disclosed herein unless otherwise indicated.

The IC structure 100 of FIG. 1 (and the IC structures 100 of FIGS. 2-5) may include a device layer 103 including a plurality of fins 104 of a semiconductor material (e.g., silicon and/or another suitable material). The IC structure 100 of FIG. 1 (and the IC structures 100 of FIGS. 2-5) may further include gate stacks 106 on a top surface and sidewalls of the fins 104 in respective gate regions, and S/D electrodes 108 on a top surface and sidewalls of the fins 104 in respective diffusion regions. In some embodiments, the IC structure 100 of FIG. 1 (and the IC structures 100 of FIGS. 2-5) may further include spacers (e.g., sidewall spacers) 124 between the S/D electrodes 108 and the gate stacks 106. Additionally, or alternatively, a dielectric 126 may be between the fins 104, above the device layer 103, and/or below the device layer 103.

The gate stack 106 may include a gate electrode including one or more layers, such as gate electrode layer 112, gate electrode layer 114, and/or gate electrode layer 116. The gate electrode layers 112, 114, and/or 116 may include any suitable material or materials, as described herein. The gate stack 106 may further include a gate dielectric 118 between the gate electrode and the fin 104. The gate dielectric 118 may include any suitable material or materials, as described herein. The S/D electrodes 108 may include one or more layers, such as S/D electrode layer 120 and/or S/D electrode layer 122. The S/D electrode layers 120 and/or 122 may include any suitable materials as described herein for source/drain contacts.

In various embodiments, the device layer interconnect 102 may extend through the device layer 103. As shown in FIGS. 1A, 1B, and 1C, the device layer interconnect 102 may be in a diffusion region of the device layer 103 (e.g., of a dummy transistor in the device layer 103) that would normally include an S/D electrode 108 (e.g., for a logic transistor in the transistor array). The device layer interconnect 102 may provide a conductive connection between a frontside interconnect 128 and a backside interconnect 130. In some embodiments, one or more vias (e.g., via 132) may couple the device layer interconnect 102 to the frontside interconnect 128 and/or the backside interconnect 130. Although illustrated herein as having substantially parallel sidewalls, any of the device layer interconnects 102 disclosed herein may have tapered sidewalls (e.g., narrowing toward the backside interconnect 130 and widening toward the frontside interconnect 128).

Spacers 124 may be between the device layer interconnect 102 and adjacent gate stacks 106. Additionally, the dielectric 126 may be between the device layer interconnect 102 and adjacent fins 104 that form transistors of the transistor array.

The device layer interconnect 102 may include any suitable conductor, such as one or more metals, including, but not limited to, copper, tungsten, tantalum, ruthenium, titanium, tantalum and nitrogen (e.g., TaN), titanium and nitrogen (e.g., TiN), etc. The device layer interconnect 102 may be formed of the same material or a different material from the frontside interconnect 128, the backside interconnect 130, and/or the via 132. Additionally, or alternatively, the device layer interconnect 102 may be formed of the same material or a different material as a material of the S/D electrode 108 (e.g., the S/D electrode layer 120 and/or 122).

In some embodiments, the device layer interconnect 102 may include a first portion 134 and a second portion 136, with the first portion 134 having a larger width than the second portion 136 (e.g., in a direction that is transverse to the orientation of the fins 104), as shown in FIG. 1C. The first portion 134 may be coplanar with the S/D electrodes 108 of adjacent transistors in the device layer 103. The second portion 136 may be below the first portion 134, and may couple the first portion 134 to the backside interconnect 130. In some embodiments, the first portion 134 and second portion 136 may be formed by separate deposition processes, during formation of the device layer interconnect 102. The first portion 134 and second portion 136 may be the same or different materials.

In various embodiments, a device layer interconnect 102 may extend across multiple fins 104. For example, in some embodiments, the transistors formed by the fins 104 may be tri-gate transistors, and the device layer interconnect 102 may extend across three fins 104. In some embodiments, a portion or all of the fins may be preserved within the device layer interconnect 102, as shown in FIG. 1C. The conductive material of the device layer interconnect 102 may be between the fins 104. The selective epitaxial growth of fins 104 in a typical junction is blocked by a patterned resist layer, thereby allowing the conductive material filled between the fins 104 to electrically couple the frontside interconnect 128 and the backside interconnect 130.

Any suitable technique may be used to form the IC structures 100 disclosed herein. For example, in some embodiments, the transistors and device layer interconnects 102 may be formed, and then the frontside interconnects 128 may be formed. After the frontside structures have been fabricated, the remaining substrate (e.g., a semiconductor wafer) at the backside may be thinned, exposing the bottom faces of the device layer interconnects 102. The backside interconnects 130, and any other backside structures, may then be formed (and may, for example, couple to the exposed bottom faces of the device layer interconnects 102).

Figure 2A:
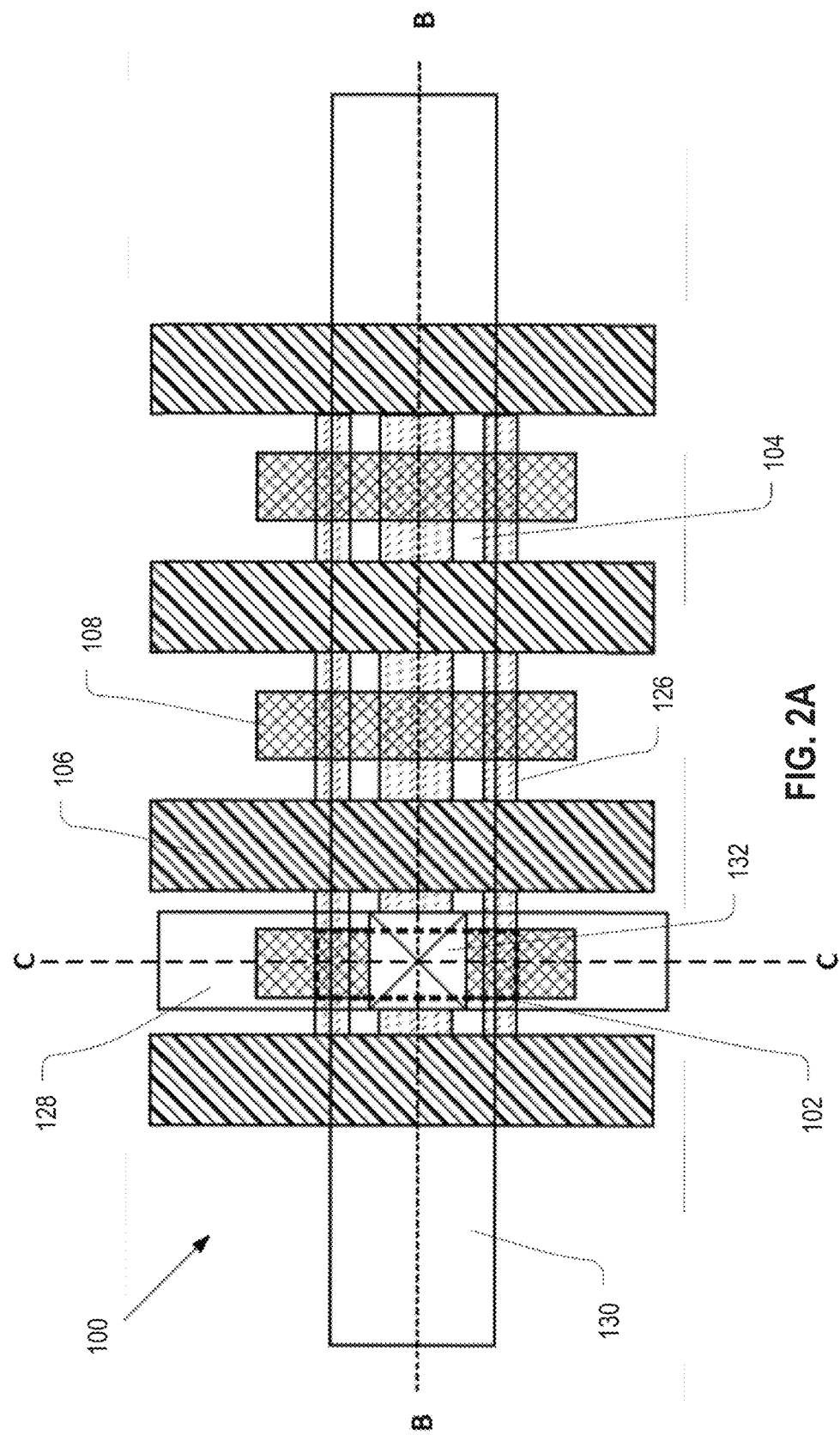

In other embodiments, the fins may be removed from the trench in which the device layer interconnect is formed, enabling more conductive material to be filled in the trench and thereby providing lower resistance for the device layer interconnect. For example, FIGS. 2A, 2B, and 2C illustrate an IC structure 100 in which the fins 104 have been removed from the region occupied by the device layer interconnect 102. FIG. 2A illustrates a top view of the IC structure 100, FIG. 2B illustrates a side cross-sectional view along the line B-B in FIG. 2A, and FIG. 2C illustrates a side cross-sectional view along the line C-C in FIG. 2A. The IC structure 100 of FIG. 2 may be included in a 3D IC. The device layer interconnect 102 of IC structure 100 may provide a lower resistance than the device layer interconnect 102 of IC structure 100, but at the cost of increased manufacturing complexity.

Figure 3A:
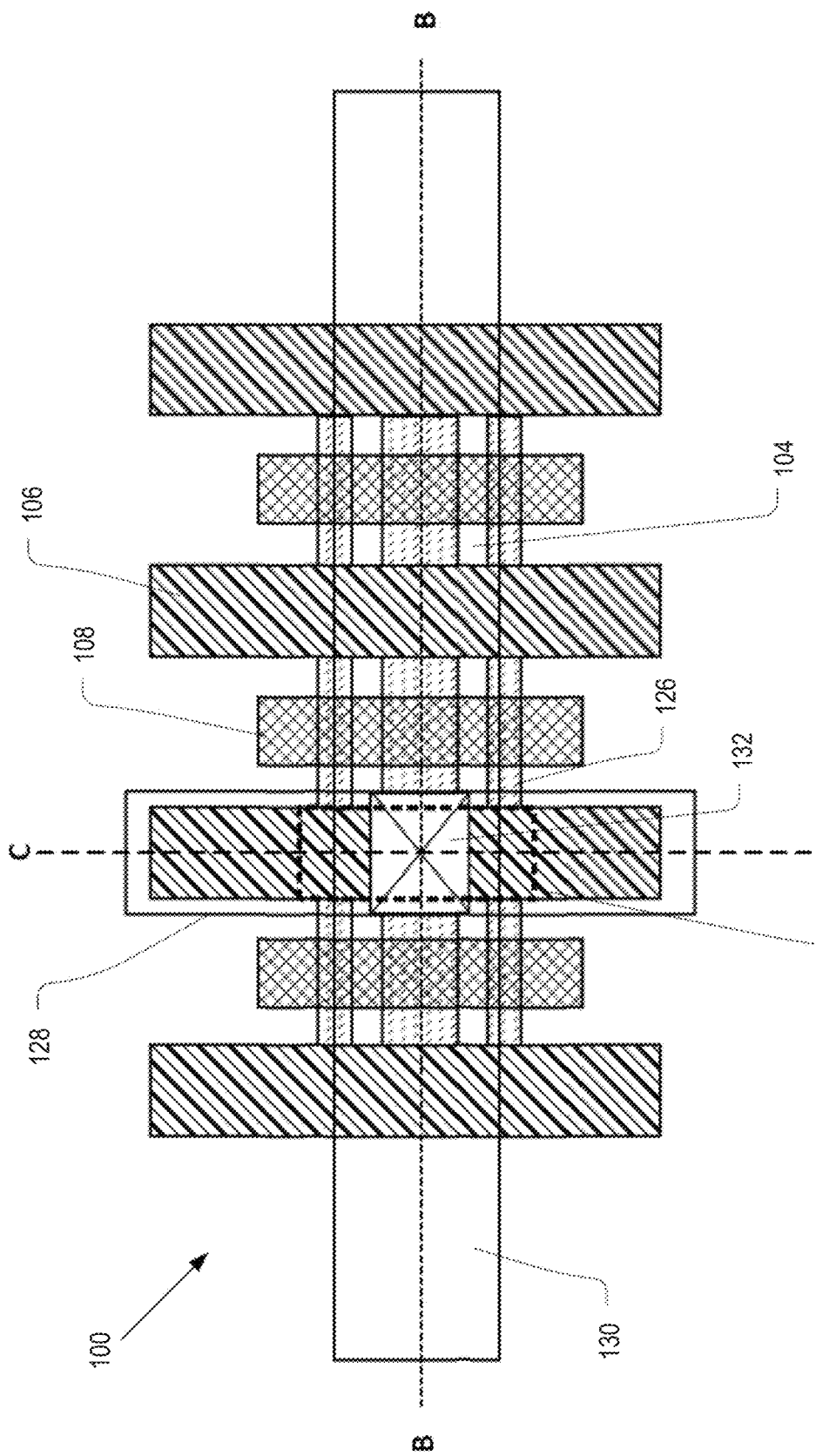
FIGS. 3A-3C are various views of another IC structure including a device layer interconnect in a device layer of the IC structure, in accordance with various embodiments.
Figures 3B, 3C:
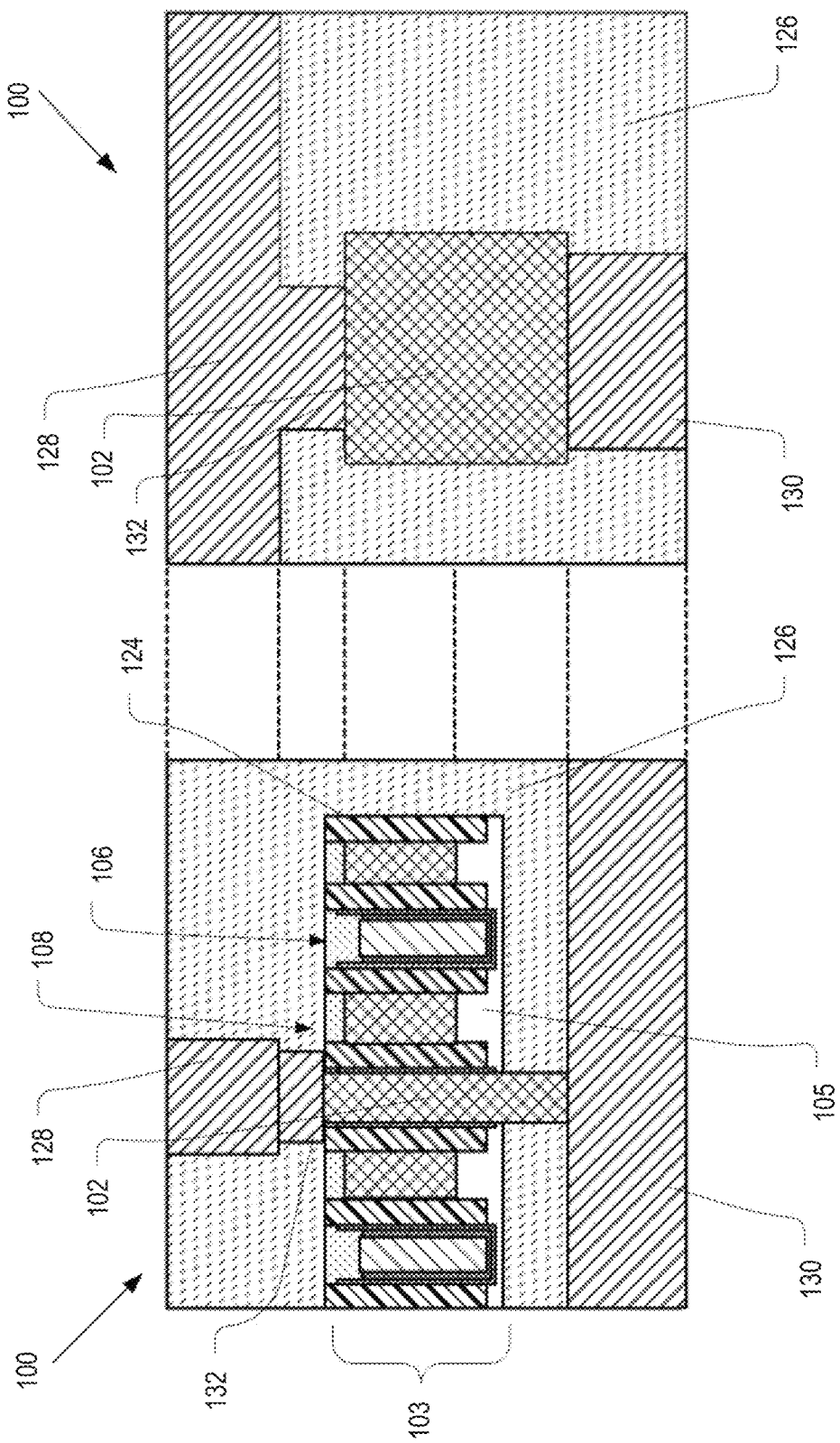

In some embodiments, a device layer interconnect 102 may be formed in the gate region of the device layer in a 3D IC. For example, FIG. 3A illustrates a top view of an IC structure 100 including a device layer interconnect 102 in a gate region of a device layer 103, in accordance with various embodiments. FIG. 3B illustrates a side cross-sectional view along the line B-B in FIG. 3A, and FIG. 3C illustrates a side cross-sectional view along the line C-C in FIG. 3A. The IC structure 100 of FIG. 3 may be included in a 3D IC.

In the embodiment of FIG. 3, the device layer interconnect 102 may be formed in a gate region of the transistor array in the device layer 103 that would otherwise have a gate stack 106. Spacers 124 may be between the device layer interconnect 102 and adjacent S/D electrodes 108. Additionally, the dielectric 126 may be between the device layer interconnect 102 and adjacent fins 104 that form transistors of the transistor array.

The device layer interconnect 102 may electrically couple a frontside interconnect 128 with a backside interconnect 130 (e.g., via a via 132). In some embodiments, the device layer interconnect 102 may have the same width across the entire device layer 103.

Figure 4A:
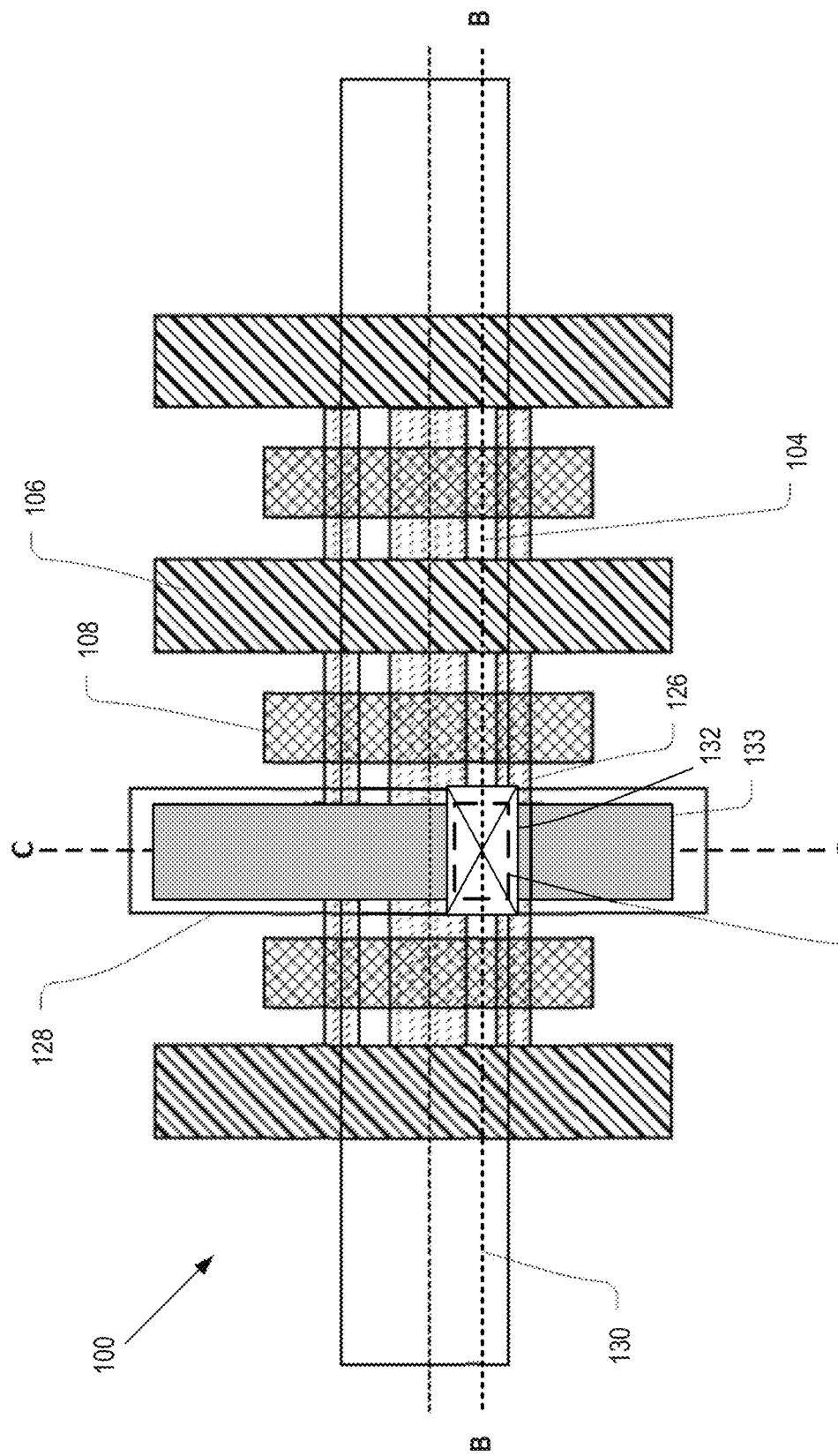

In some IC dies, different sets of transistors on a single fin 104 may be electrically isolated from each other by trenches filled with a dielectric (or "isolation") material. These isolation trenches may be oriented perpendicular to a fin 104, and may "cut across" multiple fins 104. In some embodiments, an isolation trench may take the place of a gate; such isolation trenches may thus be referred to as "dummy gates." For example, FIG. 4A illustrates a top view of an IC structure 100 including a device layer interconnect 102 in a dummy gate region of a device layer 103, in accordance with various embodiments. FIG. 4B illustrates a side cross-sectional view along the line B-B in FIG. 4A, and FIG. 4C illustrates a side cross-sectional view along the line C-C in FIG. 4A. The IC structure 100 of FIG. 4 may be included in a 3D IC, and may be particularly useful for delivering power from the backside of a die to the device layer 103 (through the backside interconnect 130 and the device layer interconnect 102).

In the embodiment of FIG. 4, the device layer interconnect 102 may be formed in a dummy gate region of the transistor array in the device layer 103 that would otherwise have an isolation material 133; that isolation material 133 may be disposed in a trench in an area that may itself otherwise have been a gate region. An IC structure 100 like the IC structure 100 of FIG. 4 may be fabricated in any suitable manner; for example, after the gate stacks 106 are formed, trenches may be formed and filled with isolation material 133, then portions of that isolation material 133 (and the underlying fin 104 and any underlying dielectric 105) may be etched away and filled with a conductive material to form the device layer interconnects 102.

FIG. 4 illustrates an isolation material 133 on opposite faces of the device layer interconnect 102 in a direction perpendicular to the fins 104. The S/D electrodes 108 may make contact with S/D regions 135 (e.g., diffusion regions) in the fin 104; as shown in FIG. 4, the device layer interconnect 102 may make contact with the S/D regions 135 on opposite faces of the device layer interconnect 102 along the fin 104. Further, the device layer interconnect 102 may make contact with the S/D electrodes 108 on opposite faces of the device layer interconnect 102 along the fin 104.

Thus, the device layer interconnect 102 of FIG. 2 may be electrically coupled to the adjacent S/D regions 135 and S/D electrodes 108. When the device layer interconnect 102 takes the place of isolation material 133 that would have otherwise separated different logic cells (e.g., as discussed below with reference to FIG. 6), the device layer interconnect 102 may electrically couple the different logic cells. In the embodiment of FIG. 4 (and FIG. 5), the S/D electrodes 108 may be local interconnect trenches (LITs) that span multiple fins 104.

In some embodiments, the device layer interconnect 102 of FIG. 4 may electrically couple a frontside interconnect 128 with a backside interconnect 130 (e.g., via a via 132). In other embodiments, the device layer interconnect 102 may couple the adjacent S/D regions 135 and S/D electrodes 108 to a backside interconnect 130, but may not couple the S/D regions 135 and S/D electrodes 108 to any frontside interconnect 128. In some embodiments, a single device layer interconnect 102 like that illustrated in FIG. 4 may span multiple fins 104 or a single fin 104 (e.g., as illustrated in FIG. 4A and as discussed below with reference to FIG. 6).

Figure 5A:
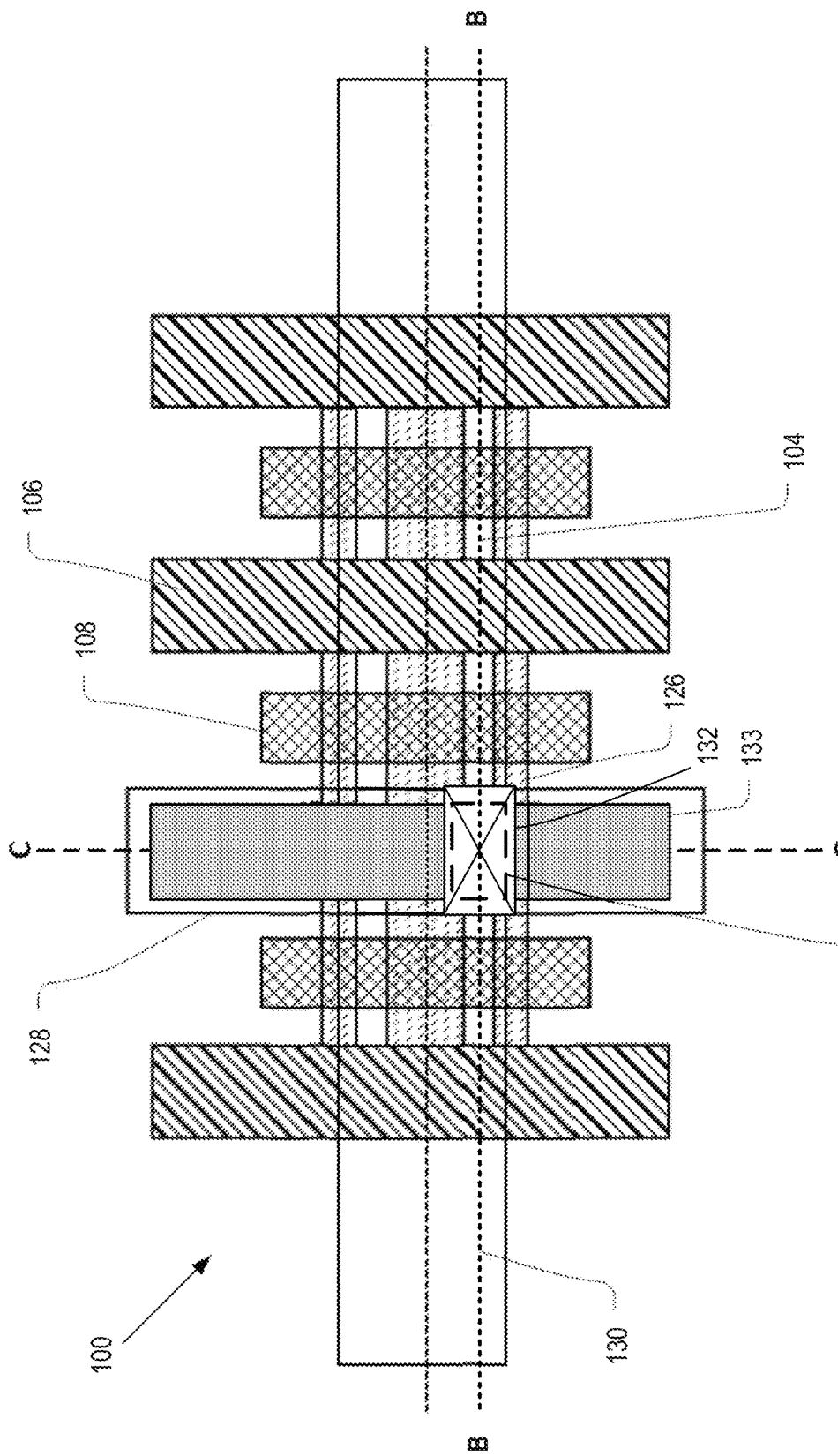
FIGS. 5A-5C are various views of another IC structure including a device layer interconnect in a device layer of the IC structure, in accordance with various embodiments.
Figures 5B, 5C:
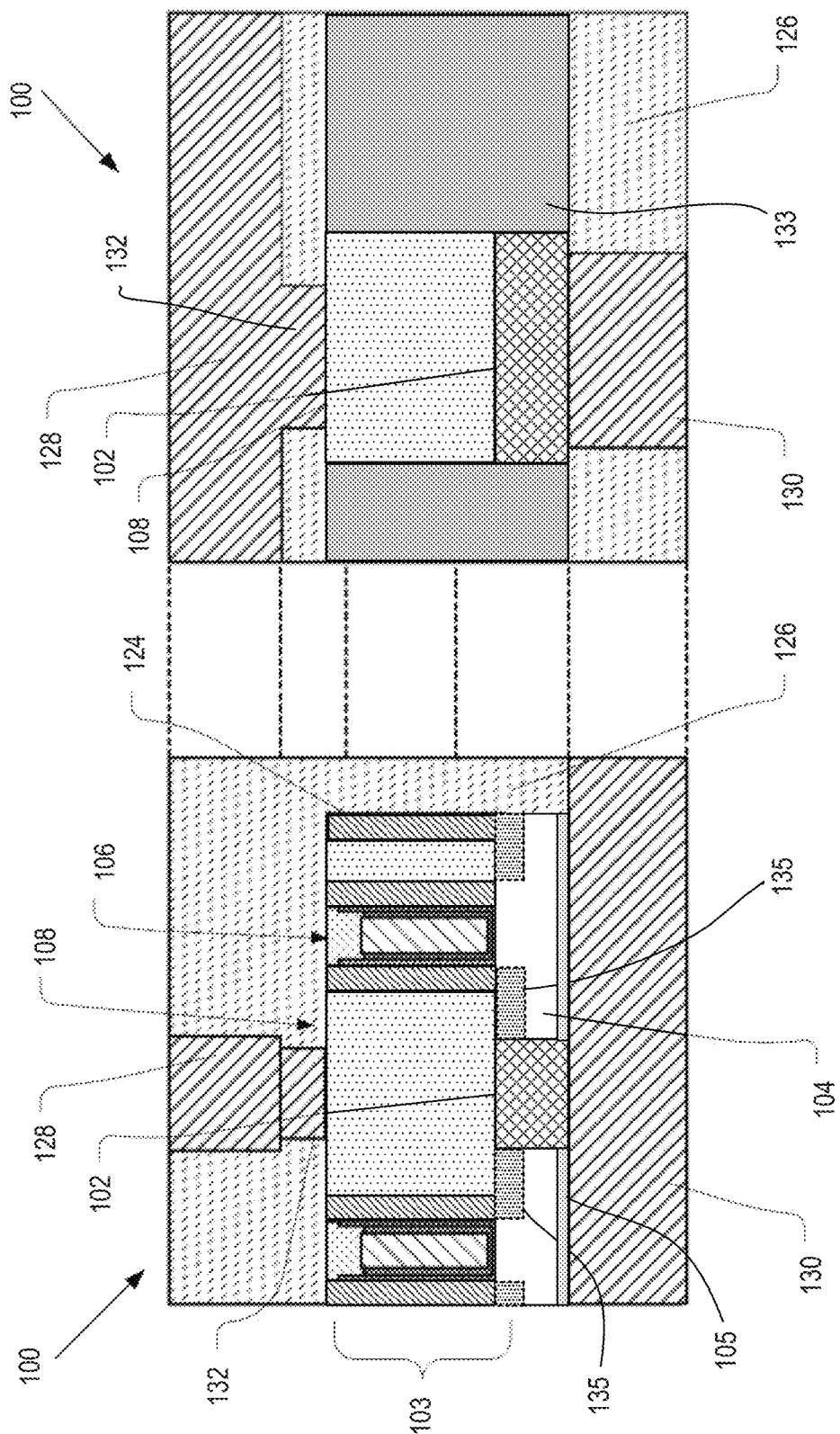

In some embodiments in which the device layer interconnect 102 is located in a dummy gate region, the conductive material of the device layer interconnect 102 (e.g., a metal) may extend up to and beyond the top of the fin 104 (e.g., as illustrated in FIG. 4) or may stop at the top surface of the fin 104. In some of the latter embodiments, the S/D electrode 108 may be disposed at the top surface of the fin 104. For example, FIG. 5A illustrates a top view of an IC structure 100 similar to that of FIG. 4, but in which an S/D electrode 108 is disposed at the top surface of the device layer interconnect 102, in accordance with various embodiments. FIG. 5B illustrates a side cross-sectional view along the line B-B in FIG. 5A, and FIG. 5C illustrates a side cross-sectional view along the line C-C in FIG. 5A. The IC structure 100 of FIG. 5 may be included in a 3D IC, and may be particularly useful for delivering power from the backside of a die to the device layer 103 (through the backside interconnect 130 and the device layer interconnect 102). An IC structure 100 like the IC structure 100 of FIG. 5 may be fabricated in any suitable manner; for example, after the gate stacks 106 are formed, but before the S/D electrodes 108 are formed, trenches may be formed and filled with isolation material 133, portions of that isolation material 133 (and the fin 104 and any underlying dielectric material 105) may be etched away and filled with a conductive material to form the device layer interconnects 102, and then the S/D electrodes 108 may be formed above the fin 104 and the device layer interconnects 102. In some embodiments, forming the device layer interconnects 102 of FIGS. 4 and 5 may include etching the underlying fin 104 to a depth between 100 nanometers and 200 nanometers (e.g., between 125 nanometers and 175 nanometers) and then filling the resulting trench with a conductive material. The device layer interconnects 102 of FIGS. 4 and 5 may be readily integrated into existing process flows (e.g., in accordance with the fabrication techniques described above).

Figure 6:
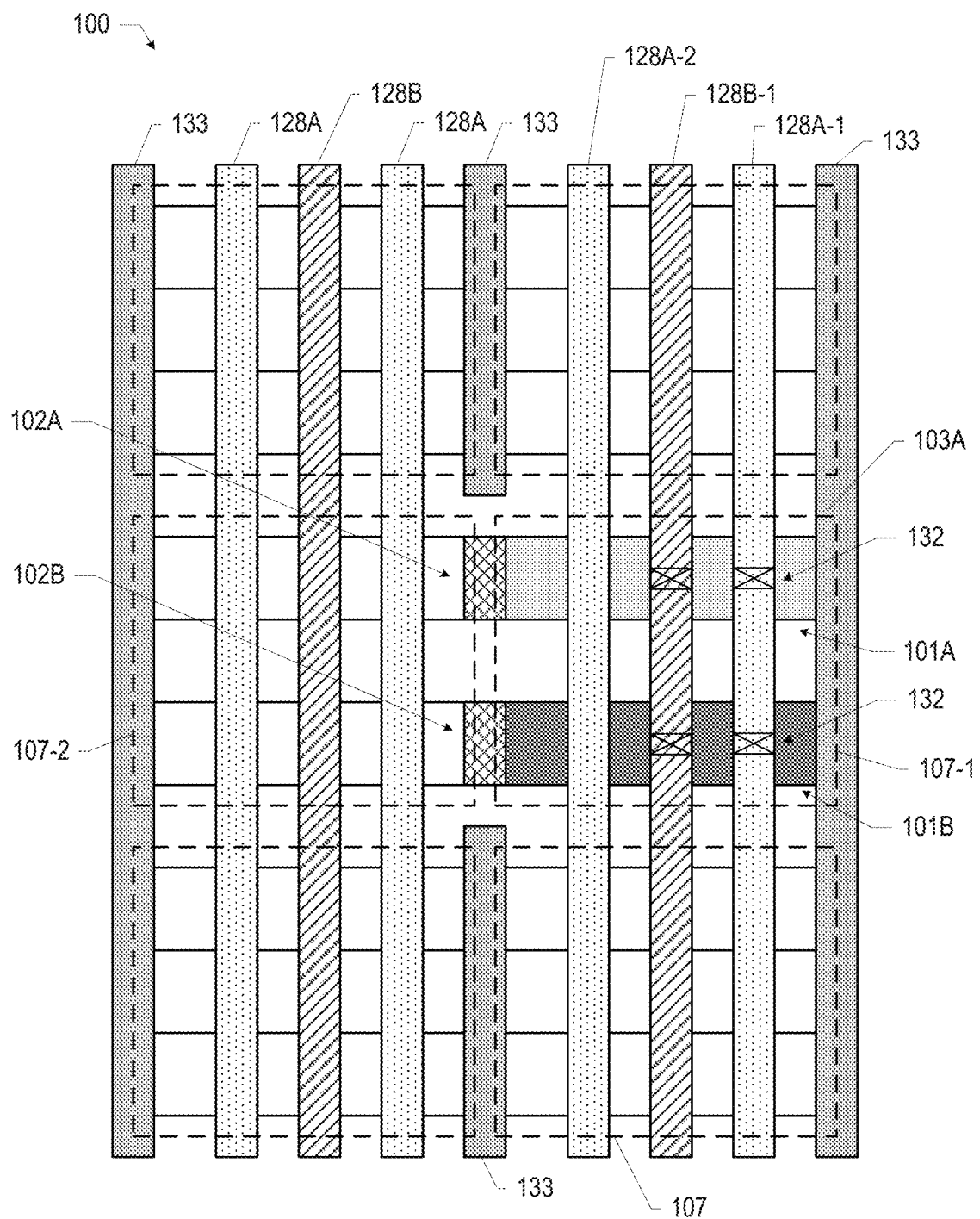
FIG. 6 is a top view of another IC structure including a device layer interconnect in a device layer of the IC structure, in accordance with various embodiments.

FIG. 6 illustrates an IC structure 100 including multiple different logic cells 107 (indicated by dashed boxes). A single fin 104 may span multiple logic cells 107, and different logic cells 107 may be separated by isolation material 133 ("dummy gates"). Further, various frontside interconnects 128 may span multiple logic cells 107; in FIG. 6, interconnects 128A may selectively couple to S/D regions 135 (not shown) and the interconnects 128B may selectively couple to gate stacks 106 (not shown). For example, the interconnects 128A may be LITs. For ease of illustration, the detailed structure of most of the logic cells 107 is omitted, and only an example detailed structure for the cell 107-1 is shown in FIG. 6. In particular, the cell 107-1 is shown as having an inverter structure in which one transistor 101A is a PMOS transistor having a S/D region 135 (not shown) coupled to an S/D region 135 (not shown) of an NMOS transistor 101B by vias 132 and an interconnect 128A-1. The gate stacks 106 of the PMOS transistor 101A and the NMOS transistor 101B are coupled by vias 132 and an interconnect 128B-1, another S/D region 135 (not shown, but under the interconnect 128A-2) of the transistor 101A is coupled to a positive voltage supply plane (e.g., Vcc) at the backside by a device layer interconnect 102A, and another S/D region 135 (not shown, but under the interconnect 128A-2) of the NMOS transistor 101B is coupled to a negative voltage supply plane (e.g., Vss) at the backside by a device layer interconnect 102B. The device layer interconnects 102 of FIG. 6 may take any of the forms discussed above with reference to FIGS. 4 and 5, for example. During operation, an input to the logic cell 107-1 may be provided on the interconnect 128A-1, and the output of the logic cell 107-1 may be read at the interconnect 1288-1. In some embodiments in which a device layer interconnect 102 is positioned in a dummy gate region (one that would otherwise include an isolation material 133), the device layer interconnect 102 may electrically couple two adjacent cells; for example, FIG. 6 illustrates that the logic cells 107-1 and 107-2 may be electrically coupled by their shared contact with the device layer interconnects 102.

Figure 7:
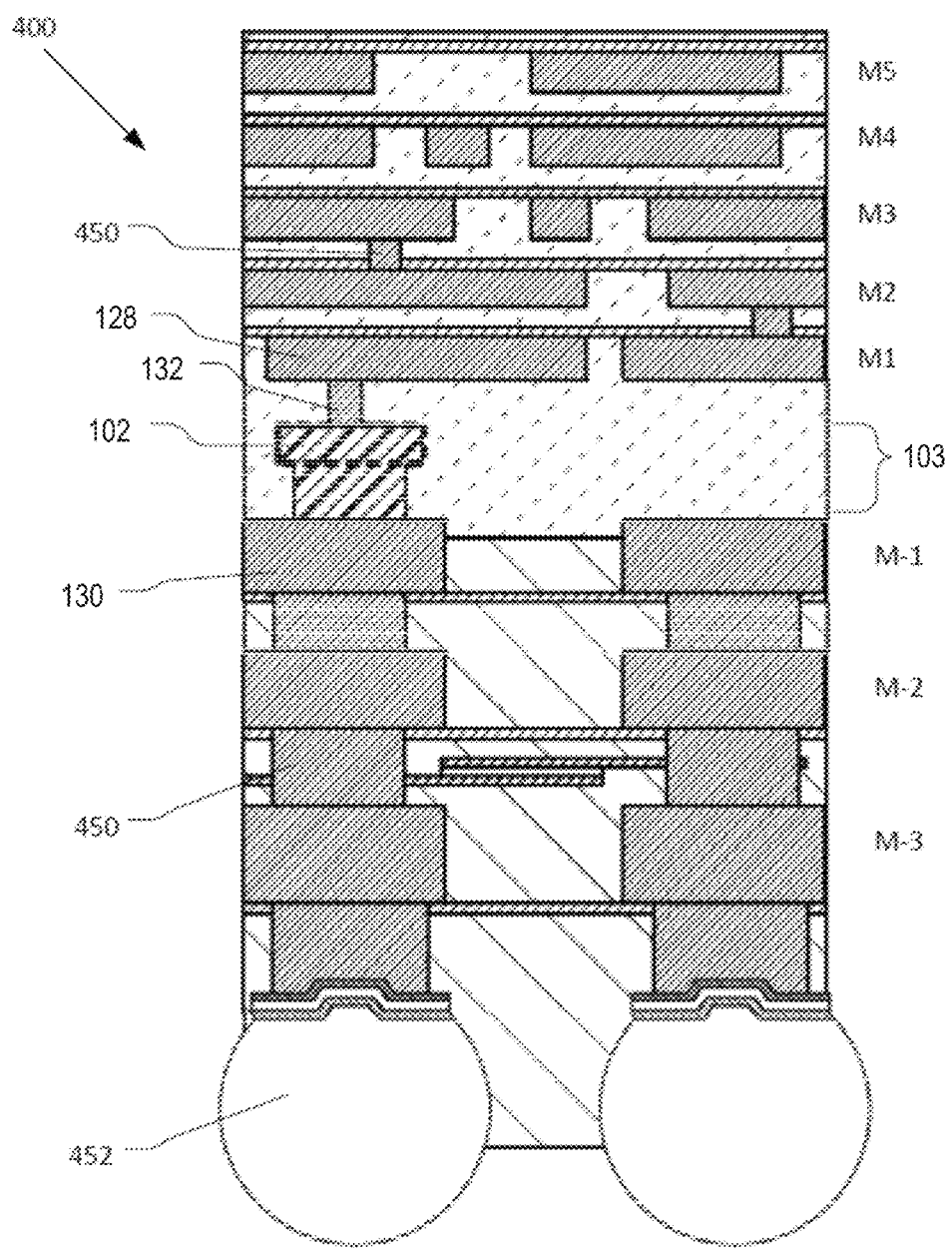
FIG. 7 illustrates a cross-sectional side view of a three-dimensional (3D) IC that includes a device layer interconnect in a device layer of the 3D IC to electrically couple a frontside interconnect with a backside interconnect of the 3D IC, in accordance with various embodiments.

FIG. 7 illustrates a cross-sectional side view of a 3D IC 400 that includes a device layer interconnect 102, in accordance with various embodiments. The device layer interconnect may take the form of any of the device layer interconnects 102 disclosed herein.

The device layer interconnect 102 may be in a device layer 103 of the 3D IC, along with logic transistors. For example, the device layer interconnect 102 may be formed in a diffusion region or gate region of a dummy transistor, or in a dummy gate region.

The 3D IC 400 may further include frontside interconnects 128 and backside interconnects 130 on opposite sides of the device layer 103. The frontside interconnects 128 may be in respective interconnect layers, e.g., M1, M2, M3, M4, M5, and the backside interconnects 130 may be in respective backside interconnect layers, e.g., M-1, M-2, M-3. It will be apparent that other embodiments may have a different number of frontside interconnect layers and/or backside interconnect layers than the numbers of layers illustrated in FIG. 7. The device layer interconnect 102 may electrically couple a frontside interconnect 128 (e.g., in frontside metal layer M1) with a backside interconnect 130 (e.g., in backside metal layer M-1). In some embodiments, a via 132 may electrically couple the device layer interconnect 102 to the frontside interconnect 128, as shown. Additional vias 450 may electrically couple frontside interconnects 128 or backside interconnects 130 to other frontside interconnects 128 or backside interconnects 130 in different metal layers. Although a single device layer interconnect 102 is shown in FIG. 7, the 3D IC 400 may include a plurality of device layer interconnects 102 in some embodiments. Further, a 3D IC 400 (or any other IC) may include any combination of the different types of device layer interconnects 102 disclosed herein. For example, the 3D IC 400 (or any other IC) may include a selected one of device layer interconnects in respective gate regions, device layer interconnects in respective diffusion regions, device layer interconnects in respective dummy gate regions, or a mixture of these different types of device layer interconnects.

Electrical signals, such as power and/or input/output (I/O) signals, may be routed to and/or from the transistors and/or device layer interconnects 102 of the device layer 103 through the front- and backside interconnect layers disposed on the device layer 103. For example, electrically conductive features of the device layer 103 (e.g., the gate and the S/D contacts of a transistor, or the device layer interconnects 102) may be electrically coupled with the interconnect structures of the interconnect layers. The device layer interconnects 102 may provide a conductive path between frontside interconnects and/or circuit devices and backside interconnects and/or circuit devices. The conductive path may be area-efficient while still providing a low resistance and capacitance. The device layer interconnects 102 may enable efficient high speed input/output (I/O) signals to be transferred across the device layer 103 of the 3D IC 400. Interconnect structures may be arranged within the interconnect layers to route electrical signals according to a wide variety of designs (in particular, the arrangement is not limited to the particular configuration of interconnect structures depicted in FIG. 7). In some embodiments, the interconnect structures may include lines and/or vias filled with an electrically conductive material such as a metal. The lines may be arranged to route electrical signals in a direction of a plane that is substantially parallel with a surface of the substrate upon which the device layer 103 is formed. For example, the lines may route electrical signals in a direction in and out of the page from the perspective of FIG. 7. The vias may be arranged to route electrical signals in a direction of a plane that is substantially perpendicular to the surface of the substrate upon which the device layer 103 is formed. In some embodiments, the vias may electrically couple lines of different interconnect layers together. The interconnect layers may include one or more dielectric materials disposed between the interconnect structures. In some embodiments, the dielectric material disposed between the interconnect structures in different ones of the interconnect layers may have different compositions. Although the lines and the vias are structurally delineated with a line within each interconnect layer for the sake of clarity, the lines and the vias may be structurally and/or materially contiguous (e.g., simultaneously filled during a dual-damascene process) in some embodiments.

The 3D IC 400 may include a solder resist material (e.g., polyimide or similar material) and one or more conductive contacts formed on the interconnect layers. In FIG. 7, chip-level contacts 452 are illustrated as taking the form of solder bumps. The chip-level contacts 452 may be electrically coupled with the interconnect structures and configured to route the electrical signals of the transistors and the device layer interconnects 102 to other external devices (e.g., a circuit board or another IC).

The structures disclosed herein (e.g., the IC structures 100 or 3D ICs 400) may be included in any suitable electronic component. FIGS. 8-11 illustrate various examples of apparatuses that may include any of the structures disclosed herein.

Figure 8:
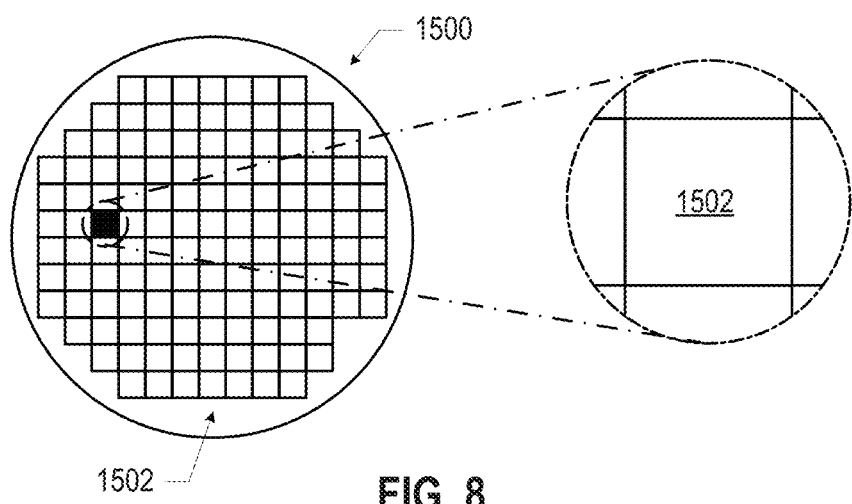
FIG. 8 is a top view of a wafer and dies that may include a device layer interconnect, in accordance with any of the embodiments disclosed herein.

FIG. 8 is a top view of a wafer 1500 and dies 1502 that may include one or more IC structures 100 or others of the structures disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more device layer interconnects 102 (e.g., in accordance with any of the embodiments disclosed herein), one or more transistors (e.g., in accordance with any of the embodiments disclosed herein), supporting circuitry to route electrical signals to the transistors and the device layer interconnects 102, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 11) or other logic that is configured to store information in the memory devices or execute instructions stored in the memory array.

Figure 9:
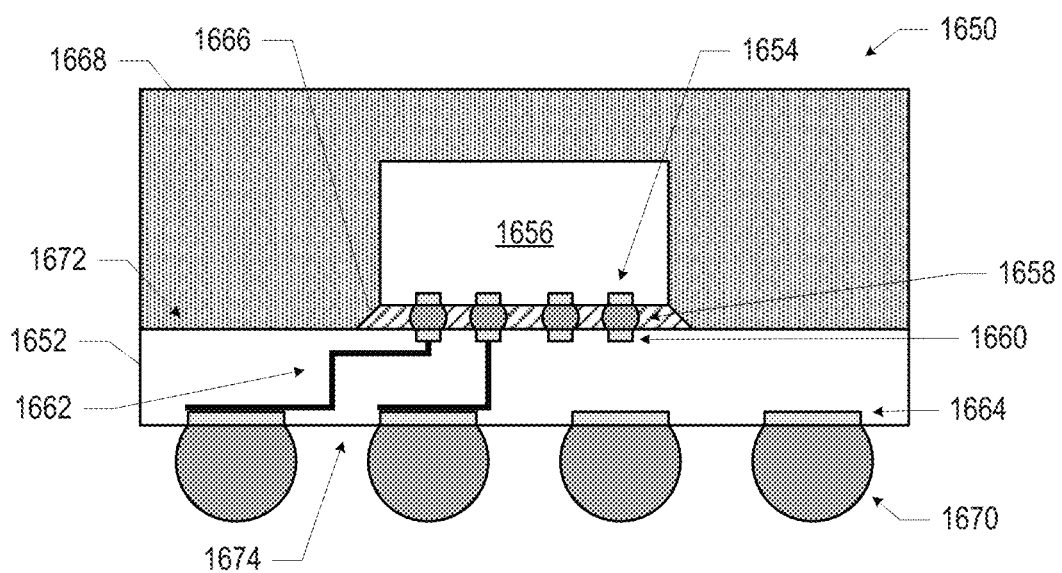
FIG. 9 is a cross-sectional side view of an IC package that may include a device layer interconnect, in accordance with various embodiments.

FIG. 9 is a cross-sectional side view of an example IC package 1650 that may include a die that includes one or more device layer interconnects 102, in accordance with any of the embodiments disclosed herein. The IC package 1650 may include a die 1656 coupled to the package substrate 1652 via conductive contacts 1654 of the die 1656, first-level interconnects 1658, and conductive contacts 1660 of the package substrate 1652. The conductive contacts 1660 may be coupled to conductive pathways 1662 through the package substrate 1652, allowing circuitry within the die 1656 to electrically couple to various ones of the conductive contacts 1664 (or to other devices included in the package substrate 1652, not shown). The first-level interconnects 1658 illustrated in FIG. 9 are solder bumps, but any suitable first-level interconnects 1658 may be used. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). The package substrate 1652 may be formed of a dielectric material, and may have conductive pathways (including, e.g., vias and lines) extending through the dielectric material between the surface 1672 and the surface 1674, or between different locations on the surface 1672, and/or between different locations on the surface 1674.

In some embodiments, an underfill material 1666 may be disposed between the die 1656 and the package substrate 1652 around the first-level interconnects 1658, and a mold compound 1668 may be disposed around the die 1656 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 9 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 10.

The die 1656 may take the form of any of the embodiments of the die 1502 discussed herein (e.g., may include any of device layer interconnects 102, IC structures 100, or 3D ICs 400 disclosed herein).

Although the IC package 1650 illustrated in FIG. 9 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 9, an IC package 1650 may include multiple dies 1656. An IC package 1650 may include additional passive components, such as surface-mount resistors, capacitors, and inductors disposed on the first surface 1672 or the second surface 1674 of the package substrate 1652. More generally, an IC package 1650 may include any other active or passive components known in the art.

FIG. 10 is a cross-sectional side view of an IC device assembly 1700 that may include one or more dies including one or more device layer interconnects 102, IC structures 100, or 3D ICs 400, in accordance with any of the embodiments disclosed herein. The IC device assembly 1700 includes a number of components disposed on a circuit board 1702 (which may be, e.g., a motherboard). The IC device assembly 1700 includes components disposed on a first surface 1740 of the circuit board 1702 and an opposing second surface 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 9.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 10 includes a package-on-interposer structure 1736 coupled to the first surface 1740 of the circuit board 1702 by coupling components 1716. The coupling components 1716 may electrically and mechanically couple the package-on-interposer structure 1736 to the circuit board 1702, and may include solder balls (as shown in FIG. 10), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 10, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 8), an IC device (e.g., the IC device 1600 of FIG. 10), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 10, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first surface 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 10 includes a package-on-package structure 1734 coupled to the second surface 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 11:
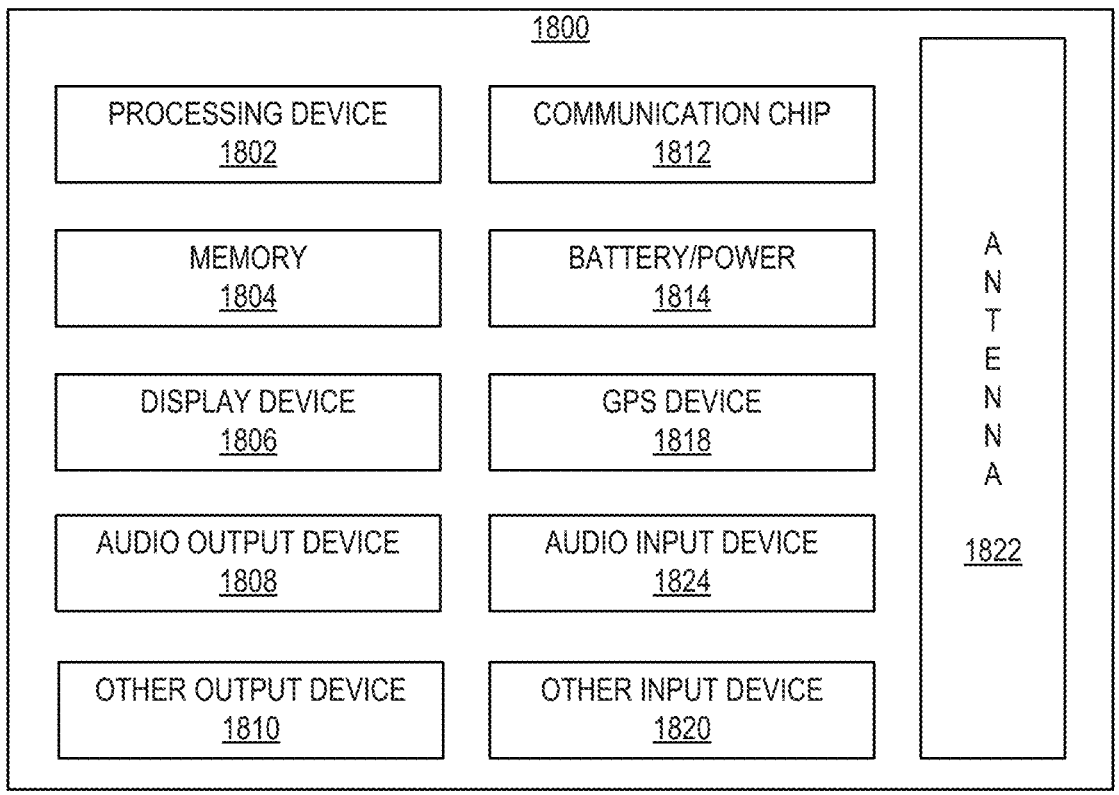
FIG. 11 is a block diagram of an example electrical device that may include a device layer interconnect, in accordance with any of the embodiments disclosed herein.

FIG. 11 is a block diagram of an example electrical device 1800 that may include one or more device layer interconnects 102, IC structures 100, or 3D ICs 400, in accordance with any of the embodiments disclosed herein. For example, any suitable ones of the components of the electrical device 1800 may include one or more of the IC packages 1650, IC devices 1600, or dies 1502 disclosed herein. A number of components are illustrated in FIG. 11 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 11, but the electrical device 1800 may include interface circuitry for coupling to the one or more components. For example, the electrical device 1800 may not include a display device 1806, but may include display device interface circuitry (e.g., a connector and driver circuitry) to which a display device 1806 may be coupled. In another set of examples, the electrical device 1800 may not include an audio input device 1824 or an audio output device 1808, but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide examples of various ones of the embodiments disclosed herein.

Example 1 is an integrated circuit (IC) die, including: a device layer including a transistor array; a backside interconnect on a backside of the device layer; and a device layer interconnect in the device layer, electrically coupled to the backside interconnect, wherein the device layer interconnect is in conductive contact with a first source/drain region at a first surface of the device layer interconnect and a second source/drain region at a second, opposite surface of the device layer interconnect.

Example 2 includes the subject matter of Example 1, and further specifies that the first source/drain region is in a first portion of a semiconductor fin, and the second source/drain region is in a second portion of the semiconductor fin.

Example 3 includes the subject matter of Example 2, and further specifies that the device layer interconnect extends through the semiconductor fin.

Example 4 includes the subject matter of any of Examples 1-3, and further specifies that the device layer interconnect has a tapered profile.

Example 5 includes the subject matter of any of Examples 1-4, and further specifies that the first surface of the device layer interconnect is in contact with a source/drain electrode.

Example 6 includes the subject matter of any of Examples 1-5, and further specifies that a top surface of the device layer interconnect is in contact with a source/drain electrode.

Example 7 includes the subject matter of any of Examples 1-6, and further specifies that the device layer interconnect is in a dummy gate region of the transistor array.

Example 8 includes the subject matter of any of Examples 1-7, and further specifies that the device layer interconnect is between a first dummy gate and a second dummy gate.

Example 9 includes the subject matter of any of Examples 1-8, and further specifies that the device layer interconnect is between a first isolation trench and a second isolation trench.

Example 10 includes the subject matter of any of Examples 1-9, and further specifies that the device layer interconnect is a first device layer interconnect through a first semiconductor fin, the IC die further includes a second device layer interconnect through a second semiconductor fin, and the first semiconductor fin is adjacent to the second semiconductor fin.

Example 11 includes the subject matter of Example 10, and further specifies that the first device layer interconnect is coupled to a positive voltage plane and the second device layer interconnect is coupled to a negative voltage plane.

Example 12 includes the subject matter of any of Examples 1-11, and further specifies that the device layer interconnect extends through a plurality of adjacent semiconductor fins.

Example 13 includes the subject matter of any of Examples 1-12, and further includes: a frontside interconnect on a frontside of the device layer; wherein the device layer interconnect is to electrically couple the frontside interconnect with the backside interconnect.

Example 14 includes the subject matter of Example 13, and further includes a via to electrically couple the device layer interconnect to the frontside interconnect.

Example 15 is a method of fabricating an integrated circuit (IC) structure, including: forming a transistor array along a semiconductor fin; and forming a device layer interconnect in the transistor array, wherein the device layer interconnect is in electrical contact with multiple different source/drain regions of the transistor array.

Example 16 includes the subject matter of Example 15, and further specifies that forming the device layer interconnect includes forming a trench through the semiconductor fin and filling the trench with a metal.

Example 17 includes the subject matter of Example 16, and further includes: before forming the trench, forming multiple different source/drain electrodes in contact with the multiple different source/drain regions.

Example 18 includes the subject matter of Example 16, and further includes: after filling the trench with a metal, forming a source/drain electrode in contact with the multiple different source/drain regions and the metal.

Example 19 includes the subject matter of any of Examples 16-18, and further specifies that the trench has a depth between 100 nanometers and 200 nanometers.

Example 20 includes the subject matter of any of Examples 15-19, and further includes: before forming the device layer interconnect, forming an isolation trench across a portion of the semiconductor fin.

Example 21 includes the subject matter of any of Examples 15-20, and further includes: after forming the device layer interconnect, forming a set of interconnects above the device layer interconnect.

Example 22 includes the subject matter of Example 21, and further specifies that the set of interconnects is a first set of interconnects, and the method further includes: after forming the first set of interconnects, removing semiconductor material below the semiconductor fin; and after removing the semiconductor material, forming a second set of interconnects below the device layer interconnect, wherein the device layer interconnect electrically couples at least one interconnect of the first set of interconnects with at least one interconnect of the second set of interconnects.

Example 23 is a computing device, including: a circuit board; and an integrated circuit (IC) die coupled to the circuit board, wherein the IC die includes a device layer including a transistor array along a semiconductor fin, and a device layer interconnect in the transistor array, wherein the device layer interconnect is in electrical contact with multiple different source/drain regions of the transistor array.

Example 24 includes the subject matter of Example 23, and further includes one or more of an antenna, a display, or a memory device coupled to the IC die.

Example 25 includes the subject matter of any of Examples 23-24, and further includes: a backside interconnect on a backside of the device layer; wherein the device layer interconnect is in conductive contact with the backside interconnect.

Example 26 includes the subject matter of Example 25, and further includes: a frontside interconnect on a frontside of the device layer; wherein the device layer interconnect is to electrically couple the frontside interconnect with the backside interconnect.

Example 27 includes the subject matter of any of Examples 23-26, and further specifies that the device layer interconnect extends through the semiconductor fin.

Example 28 includes the subject matter of any of Examples 23-27, and further specifies that the device layer interconnect has a tapered profile.

Example 29 includes the subject matter of any of Examples 23-28, and further specifies that a top surface of the device layer interconnect is in contact with a source/drain electrode.

Example 30 includes the subject matter of any of Examples 23-29, and further specifies that the device layer interconnect is in a dummy gate region of the transistor array.

Example 31 includes the subject matter of any of Examples 23-30, and further specifies that the device layer interconnect is between a first dummy gate and a second dummy gate.

Example 32 includes the subject matter of any of Examples 23-31, and further specifies that the device layer interconnect is between a first isolation trench and a second isolation trench.

Example 33 includes the subject matter of any of Examples 23-32, and further specifies that the device layer interconnect is a first device layer interconnect through a first semiconductor fin, the IC die further includes a second device layer interconnect through a second semiconductor fin, and the first semiconductor fin is adjacent to the second semiconductor fin.

Example 34 includes the subject matter of Example 33, and further specifies that the first device layer interconnect is coupled to a positive voltage plane and the second device layer interconnect is coupled to a negative voltage plane.

Example 35 includes the subject matter of any of Examples 23-34, and further specifies that the device layer interconnect extends through a plurality of adjacent semiconductor fins.

Example 36 is integrated circuit (IC) package, including: a package substrate; and an IC die coupled to the package substrate, wherein the IC die includes a device layer, a backside interconnect on a backside of the device layer, and a device layer interconnect in the device layer, electrically coupled to the backside interconnect, wherein the device layer interconnect is in conductive contact with two distinct source/drain regions.

Example 37 includes the subject matter of Example 36, and further specifies that the IC die is coupled to the package substrate by solder.

Example 38 includes the subject matter of any of Examples 36-37, and further includes a mold material around the IC die.

The invention claimed is:

1. An integrated circuit (IC) die comprising:
   a device layer including a transistor array along a semiconductor fin; and
   a device layer interconnect in the transistor array, wherein the device layer interconnect is in electrical contact with a first source/drain region and a second source/drain region of the transistor array, and the device layer interconnect extends through an isolation trench extending perpendicular to the semiconductor fin.

2. The IC die of claim 1, further comprising:
   a backside interconnect on a backside of the device layer; wherein the device layer interconnect is in conductive contact with the backside interconnect.

3. The IC die of claim 2, further comprising:
   a frontside interconnect on a frontside of the device layer; wherein the device layer interconnect electrically couples the frontside interconnect with the backside interconnect.

4. The IC die of claim 1, wherein the device layer interconnect extends through the semiconductor fin.

5. The IC die of claim 1, wherein the device layer interconnect has a tapered profile.

6. The IC die of claim 1, wherein a top surface of the device layer interconnect is in contact with a source/drain electrode.

7. The IC die of claim 1, wherein the isolation trench is a dummy gate region of the transistor array.

8. The IC die of claim 1, wherein the device layer interconnect is between a first dummy gate and a second dummy gate.

9. The IC die of claim 1, wherein the device layer interconnect is between a first isolation trench and a second isolation trench.

10. The IC die of claim 1, wherein the device layer interconnect is a first device layer interconnect through a first semiconductor fin, the IC die further comprises a second device layer interconnect through a second semiconductor fin, and the first semiconductor fin is adjacent to the second semiconductor fin.

11. The IC die of claim 10, wherein the first device layer interconnect is coupled to a positive voltage plane and the second device layer interconnect is coupled to a negative voltage plane.

12. The IC die of claim 1, wherein the device layer interconnect extends through a plurality of adjacent semiconductor fins.

13. A computing device comprising:
   a circuit board; and
   an integrated circuit (IC) die coupled to the circuit board, the IC die comprising:
      a device layer including a transistor array along a semiconductor fin; and
      a device layer interconnect in the transistor array, wherein the device layer interconnect is in electrical contact with a first source/drain region and a second source/drain region of the transistor array, and the device layer interconnect extends through an isolation trench extending perpendicular to the semiconductor fin.

14. The computing device of claim 13, the IC die further comprising:
a backside interconnect on a backside of the device layer;
wherein the device layer interconnect is in conductive contact with the backside interconnect.

15. The computing device of claim 14, the IC die further comprising:
a frontside interconnect on a frontside of the device layer;
wherein the device layer interconnect electrically couples the frontside interconnect with the backside interconnect.

16. The computing device of claim 13, wherein the device layer interconnect extends through the semiconductor fin.

17. The computing device of claim 13, wherein a top surface of the device layer interconnect is in contact with a source/drain electrode.

18. The computing device of claim 13, wherein the isolation trench is a dummy gate region of the transistor array.

19. The computing device of claim 13, wherein the device layer interconnect is a first device layer interconnect through a first semiconductor fin, the IC die further comprises a second device layer interconnect through a second semiconductor fin, and the first semiconductor fin is adjacent to the second semiconductor fin.

20. The computing device of claim 19, wherein the first device layer interconnect is coupled to a positive voltage plane and the second device layer interconnect is coupled to a negative voltage plane.

* * * * *